United States Patent
Sharf

(10) Patent No.: US 11,450,980 B2
(45) Date of Patent: Sep. 20, 2022

(54) RECEPTACLE CAGE FOR A RECEPTACLE CONNECTOR ASSEMBLY

(71) Applicant: TE Connectivity Services GmbH, Schaffhausen (CH)

(72) Inventor: Alex Michael Sharf, Harrisburg, PA (US)

(73) Assignee: TE CONNECTIVITY SOLUTIONS GmbH, Schaffhausen (CH)

( * ) Notice: Subject to any disclaimer, the term of this patent is extended or adjusted under 35 U.S.C. 154(b) by 0 days.

(21) Appl. No.: 17/140,380

(22) Filed: Jan. 4, 2021

(65) Prior Publication Data

US 2022/0216632 A1    Jul. 7, 2022

(51) Int. Cl.
*H01R 12/91*     (2011.01)
*H01R 13/424*   (2006.01)
*H05K 7/20*      (2006.01)

(52) U.S. Cl.
CPC ........... *H01R 12/91* (2013.01); *H01R 13/424* (2013.01); *H05K 7/2039* (2013.01)

(58) Field of Classification Search
CPC ...... H01R 12/91; H01R 12/70; H01R 13/424; H01R 13/42; H01R 13/40; H01R 13/6581; H05K 7/2039
USPC .................. 439/487, 607.2, 607.21, 607.27
See application file for complete search history.

(56) References Cited

U.S. PATENT DOCUMENTS

| | | | |
|---|---|---|---|
| 6,752,663 B2 * | 6/2004 | Bright ................. | H05K 9/0058 439/607.25 |
| 7,090,519 B2 | 8/2006 | Muramatsu et al. | |
| 7,322,854 B2 * | 1/2008 | Long ................. | H01R 13/6594 439/939 |
| 7,371,965 B2 | 5/2008 | Ice | |
| 7,733,652 B2 | 6/2010 | Costello et al. | |
| 8,465,320 B2 * | 6/2013 | Long ................. | H01R 13/6587 439/541.5 |
| 8,890,004 B2 * | 11/2014 | Wickes ............... | H05K 9/0009 174/382 |
| 9,313,925 B2 | 4/2016 | Kelty | |
| 9,869,837 B2 | 1/2018 | Morgan et al. | |
| 10,310,198 B1 | 6/2019 | Yatskov et al. | |
| 10,476,198 B1 * | 11/2019 | Pogash .............. | H01R 13/518 |
| 10,819,072 B2 * | 10/2020 | Suda .................. | H01R 13/6594 |
| 11,245,230 B2 * | 2/2022 | Dunwoody ........ | H01R 13/5219 |
| 2006/0003632 A1 * | 1/2006 | Long .................. | H01R 13/659 439/607.2 |
| 2006/0189211 A1 * | 8/2006 | Lang ................. | H01R 13/6594 439/607.04 |
| 2013/0051738 A1 * | 2/2013 | Ito ....................... | H05K 9/0018 385/92 |

* cited by examiner

*Primary Examiner* — Harshad G Patel

(57) ABSTRACT

A receptacle cage includes cage walls including a top wall, a first side wall, a second side wall, and a bottom wall. The cage walls form a module channel configured to receive a pluggable module. The cage walls extend between a front end and a rear end of the receptacle cage. The receptacle cage includes a lifting device located in the module channel proximate to the bottom wall. The lifting device is located remote from the front end. The lifting device has a lifting surface configured to engage the pluggable module and lift the pluggable module into the module channel to an elevated position lifted off of the bottom wall.

17 Claims, 5 Drawing Sheets

RECEPTACLE CAGE FOR A RECEPTACLE CONNECTOR ASSEMBLY

BACKGROUND OF THE INVENTION

The subject matter herein relates generally to receptacle cages.

Some communication systems utilize receptacle assemblies having communication connectors to interconnect various components of the system for data communication. The receptacle assemblies include receptacle cages that receive pluggable modules, such as I/O modules, that are electrically connected to the communication connector. The receptacle cages provide electrical shielding, such as EMI shielding, for the pluggable modules. Some known communication systems provide heat sinks attached to the receptacle cage to dissipate heat from the pluggable module. The heat sinks are typically mounted to the receptacle cage by a clip or spring that provides downward force to press the heat sink into the receptacle cage to interface with the pluggable module.

Known receptacle cages are not without disadvantages. For instance, as the pluggable module is loaded into the receptacle cage, the top of the pluggable module engages the heat sink and biases the heat sink outward. The top of the pluggable module wipes against the bottom of the heat sink as the pluggable module is loaded into the receptacle cage. Such rubbing of the pluggable module and the heat sink causes wear on the heat sink and module surfaces. Additionally, the interference between the pluggable module and the heat sink increases the loading forces for the pluggable module. Furthermore, space is needed above the heatsink to allow the heat sink to move upward during mating. Additionally, mounting hardware is needed to hold the heat sink on the receptacle cage, allow the outward movement of the heat sink, and provide spring forces to press the heat sink downward against the pluggable module for efficient thermal connection therebetween.

A need remains for a receptacle cage having improved thermal mating between the pluggable module and a heat transfer device.

BRIEF DESCRIPTION OF THE INVENTION

In one embodiment, a receptacle cage for a receptacle connector assembly is provided. The receptacle cage includes cage walls including a top wall, a first side wall, a second side wall, and a bottom wall. The cage walls form a module channel configured to receive a pluggable module. The cage walls extend between a front end and a rear end of the receptacle cage. The receptacle cage includes a lifting device located in the module channel proximate to the bottom wall. The lifting device is located remote from the front end. The lifting device has a lifting surface configured to engage the pluggable module and lift the pluggable module into the module channel to an elevated position lifted off of the bottom wall.

In another embodiment, a receptacle connector assembly is provided. The receptacle connector assembly includes cage walls including a top wall, a first side wall, a second side wall, and a bottom wall. The cage walls form a module channel configured to receive a pluggable module. The cage walls extend between a front end and a rear end of the receptacle cage. The top wall includes a top opening. The receptacle connector assembly includes a heat transfer device above the top wall. The heat transfer device includes a heat transfer surface aligned with the top opening. The receptacle connector assembly includes a lifting device located in the module channel proximate to the bottom wall. The lifting device is located remote from the front end. The lifting device has a lifting surface configured to engage the pluggable module and lift the pluggable module to an elevated position lifted off of the bottom wall into thermal contact with the heat transfer surface of the heat transfer device.

In a further embodiment, a communication system is provided. The communication system includes a pluggable module including an outer housing extending between a mating end and a cable end. The pluggable module includes an upper wall and a lower wall. The pluggable module has a cavity between the upper wall and the lower wall. The pluggable module has a module circuit card in the cavity including a card edge proximate to the mating end of the outer housing. The communication system includes a receptacle connector assembly including a receptacle cage having cage walls forming a module channel receiving the pluggable module. The cage walls include a top wall, a first side wall, a second side wall, and a bottom wall. The cage walls extend between a front end and a rear end of the receptacle cage. The receptacle connector assembly includes a communication connector having a card slot received in the receptacle cage proximate to the rear end. The receptacle connector assembly includes a heat transfer device above the top wall having a heat transfer surface. The receptacle connector assembly includes a lifting device located in the module channel proximate to the bottom wall. The lifting device has a lifting surface. The pluggable module is loaded into the module channel to mate the card edge of the module circuit card with the communication connector. The pluggable module engages the lifting surface of the lifting device during loading to lift the pluggable module to an elevated position lifted off of the bottom wall. The lifting device aligns the module circuit card with the card slot of the communication connector in the elevated position. The lifting device presses the upper wall of the pluggable module into thermal contact with the heat transfer surface of the heat transfer device in the elevated position.

DETAILED DESCRIPTION OF THE INVENTION

Figure 1:
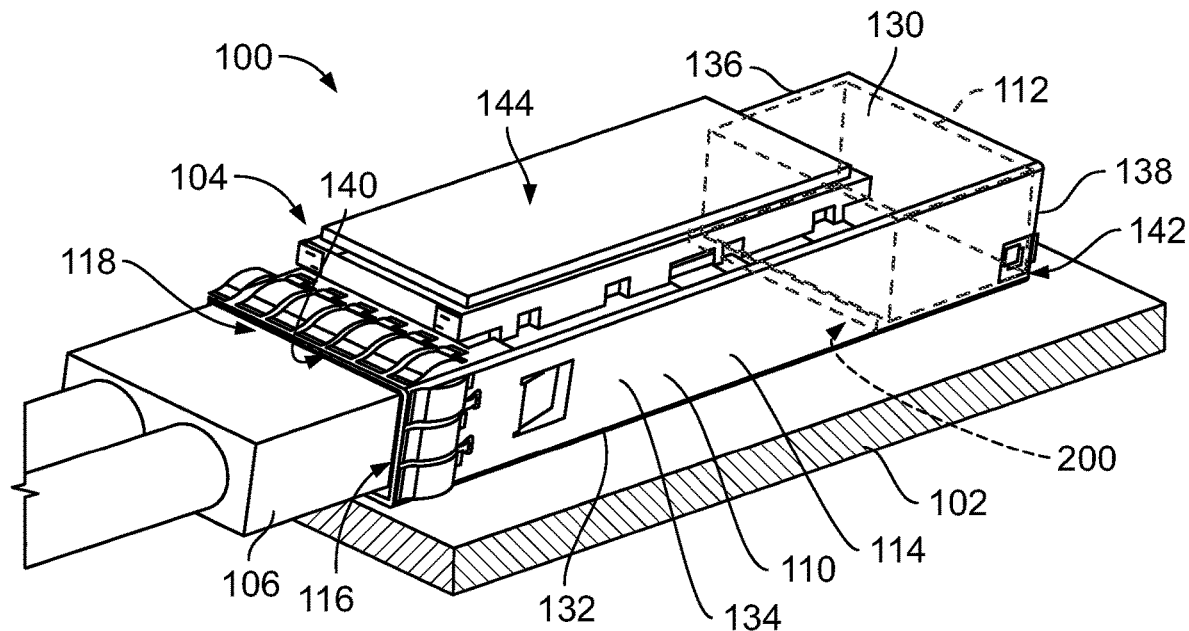
FIG. 1 is a front perspective view of a communication system formed in accordance with an exemplary embodiment.

FIG. 1 is a front perspective view of a communication system 100 formed in accordance with an exemplary embodiment. The communication system 100 includes a circuit board 102 and a receptacle connector assembly 104 mounted to the circuit board 102. A pluggable module 106 (shown in FIG. 2) is configured to be electrically connected to the receptacle connector assembly 104. The pluggable module 106 is electrically connected to the circuit board 102 through the receptacle connector assembly 104.

In an exemplary embodiment, the receptacle connector assembly 104 includes a receptacle cage 110 and a communication connector 112 (shown in phantom) adjacent the receptacle cage 110. For example, in the illustrated embodiment, the communication connector 112 is received in the receptacle cage 110. In other various embodiments, the communication connector 112 may be located rearward of the receptacle cage 110. In various embodiments, the receptacle cage 110 encloses and provides electrical shielding for the communication connector 112. The receptacle cage 110 is configured to surround at least a portion of the pluggable module 106 to provide shielding for the pluggable module 106.

The receptacle cage 110 includes a plurality of cage walls 114 surrounding a cavity 116. The cavity 116 may receive the communication connector 112 in various embodiments. The cavity 116 defines one or more module channels 118 for receipt of corresponding pluggable modules 106. The cage walls 114 may be walls defined by solid sheets, perforated walls to allow airflow therethrough, walls with cutouts, such as for a heatsink or heat spreader to pass therethrough, or walls defined by rails or beams with relatively large openings, such as for airflow therethrough. In an exemplary embodiment, the receptacle cage 110 is a shielding, stamped and formed cage member with the cage walls 114 being shielding walls.

In the illustrated embodiment, the receptacle cage 110 includes a single module channel 118 for receiving a single pluggable module 106. The receptacle cage 110 has a port that is open at the front of the receptacle cage 110 to receive the pluggable module 106. Any number of module channels 118 may be provided in various embodiments. For example, the receptacle cage 110 may constitute a stacked cage member having upper and lower module channels 118 to receive multiple pluggable modules 106 in a stacked arrangement in an alternative embodiment. The upper and lower module channels 118 may be arranged in a single column; however, the receptacle cage 110 may include multiple columns of ganged module channels 118 in alternative embodiments (for example, 2X2, 3X2, 4X2, 4X3, etc.). In other various embodiments, rather than being a stacked cage member, the receptacle cage 110 may include ganged module channels 118 in a single row (for example, 1X2, 1X4, etc.). Optionally, multiple communication connectors 112 may be arranged within the receptacle cage 110, such as when multiple columns or rows of module channels 118 are provided.

In an exemplary embodiment, the cage walls 114 of the receptacle cage 110 include a top wall 130, a bottom wall 132, a first side wall 134, a second side wall 136 and a rear wall 138. The bottom wall 132 may rest on the circuit board 102. However, in alternative embodiments, the receptacle cage 110 may be provided without the bottom wall 132. The receptacle cage 110 extends between a front end 140 and a rear end 142. The ports is provided at the front end 140 to receive the pluggable module 106 through the front end 140. The cage walls 114 define the cavity 116. For example, the cavity 116 may be defined by the top wall 130, the bottom wall 132, the side walls 134, 136 and the rear wall 138. Other cage walls 114 may separate or divide the cavity 116 into a plurality of module channels 118, such as stacked or ganged module channels. For example, the cage walls 114 may include a divider (not shown). The divider may be a horizontal divider positioned between upper and lower module channels 118. In other various embodiments, the divider may define a vertical separator panel (not shown), such as parallel to the side walls 134, 136.

In an exemplary embodiment, the communication connector 112 is received in the cavity of the receptacle cage 110, such as proximate to the rear wall 138. However, in alternative embodiments, the communication connector 112 may be located behind the rear wall 138 exterior of the receptacle cage 110 and extend into the cavity 116 to interface with the pluggable module(s) 106. For example, the rear wall 138 may include an opening to receive components therethrough. The communication connector 112 is coupled to the circuit board 102. The receptacle cage 110 is mounted to the circuit board 102 over the communication connector 112.

In an exemplary embodiment, the pluggable module 106 is loaded into the receptacle cage 110 through the front end 140 to mate with the communication connector 112. The shielding cage walls 114 of the receptacle cage 110 provide electrical shielding around the communication connector 112 and the pluggable module 106, such as around the mating interface between the communication connector 112 and the pluggable modules 106. One or more gaskets may be provided at the front end 140 to interface with the pluggable module 106 to electrically connect the receptacle cage 110 to the pluggable module 106 and to shield any gaps between the pluggable module 106 and the receptacle cage 110 to prevent EMI leakage through such gaps. The gasket(s) may extend around the exterior of the receptacle cage 110 at the front end 140 to interface with a panel (not shown).

In an exemplary embodiment, the receptacle connector assembly 104 may include one or more heat sinks 144 for dissipating heat from the pluggable module(s) 106. For example, the heat sink 144 may be coupled to the top wall 130 for engaging the pluggable module 106 when the pluggable module 106 is received in the module channel 118. The heat sink 144 may extend through an opening in the top wall 130 to directly engage the pluggable module 106. In an exemplary embodiment, the heat sink 144 may be fixed relative to the cage walls 114. For example, the heat sink 144 may be fixed relative to the top wall 130. The heat sink 144 may be secured to the cage walls 114 by a clip, fasteners, welding, adhesive, or other securing means. In other various embodiments, the heat sink 144 may be movable relative to the cage walls 114. For example, a spring clip may be used to couple to the heat sink 144 to the cage walls 114 that allows the heat sink 144 to move relative to the top wall 130

(for example, move outward when coupled to the pluggable module 106. The spring clip may impart a downward biasing force against the heat sink 144 to press the heat sink into thermal contact with the pluggable module 106. The heat sink 144 may be a finned heat sink having heat dissipating fins that extend therefrom, such as from the top of the heat sink to dissipate heat into the air flowing around the heat sink 144. Other types of heat sinks may be provided in alternative embodiments. For example, the heat sink 144 may be a thermal bridge having a plurality of stacked plates or may be a cold plate having liquid cooling flowing therethrough for active cooling of the cold plate.

In an exemplary embodiment, the receptacle cage 110 includes a lifting device 200 (shown schematically in FIG. 1) in the cavity 116 that is used to guide the pluggable module 106 into engagement with the heat sink 144. The lifting device 200 transitions the pluggable module 106 into thermal contact with the heat sink 144 when the pluggable module 106 is fully loaded into the module channel 118. In an exemplary embodiment, the lifting device 200 lifts the mating end of the pluggable module 106 toward the heat sink 144 to drive the pluggable module 106 into thermal contact with the heat sink 144. In an exemplary embodiment, the pluggable module 106 is free to move relative to the heat sink 144 as the pluggable module 106 is plugged into the module channel until the very end of the loading process, where the lifting device 200 interacts with the pluggable module 106 and presses the pluggable module 106 into engagement with the heat sink 144. For example, clearance is provided between the pluggable module 106 and the heat sink 144 as the pluggable module 106 is loaded into the module channel 118 for the majority of the loading process. Once the pluggable module 106 interfaces with the lifting device 200, the pluggable module 106 is moved into engagement with the heat sink 144, such as at the very end of the loading process. By separating the pluggable module 106 from the heat sink 144 for the vast majority of the loading process, insertion forces for the pluggable module 106 are reduced. Additionally, wear on the surfaces of the heat sink 144 and the pluggable module 106 are reduced.

Figure 2:
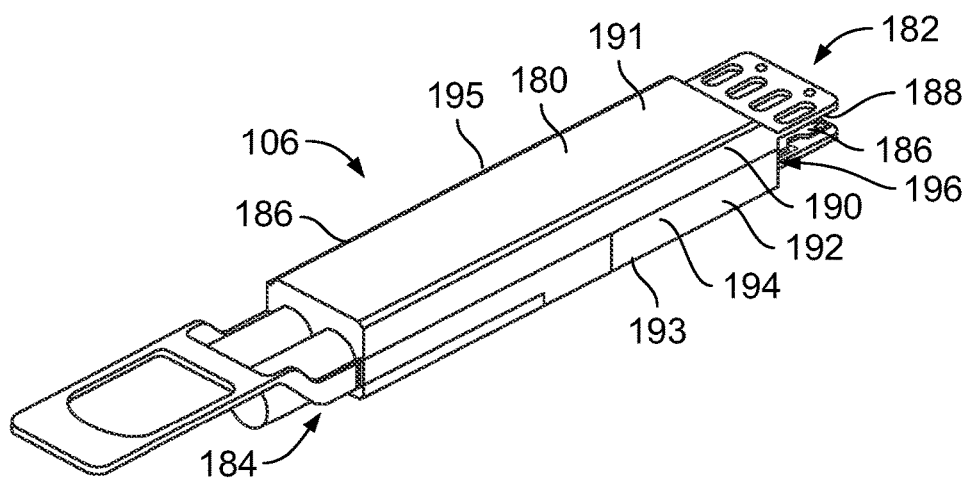
FIG. 2 is a front perspective view of a pluggable module of the communication system in accordance with an exemplary embodiment.

FIG. 2 is a front perspective view of the pluggable module 106 in accordance with an exemplary embodiment. The pluggable module 106 has a pluggable body 180, which may be defined by one or more shells. For example, the pluggable body 180 may include an upper shell 190 and a lower shell 192. The upper shell 190 includes a top wall 191. The lower shell 192 includes a bottom wall 193. The upper shell 190 and/or the lower shell 192 includes side walls 194, 195. The pluggable body 180 includes a cavity 196 defined between the upper shell 190 and the lower shell 192. In an exemplary embodiment, the pluggable body 180 may be thermally conductive and/or may be electrically conductive, such as to provide EMI shielding for the pluggable module 106. For example, the upper shell 190 and the lower shell 192 may be die cast shells manufactured from metal material, such as aluminum. The pluggable body 180 includes a mating end 182 and an opposite front end 184. The front end 184 may be a cable end having a cable extending therefrom to another component within the system. The mating end 182 is configured to be inserted into the corresponding module channel 118 (shown in FIG. 1).

The pluggable module 106 includes a module circuit board 186 that is configured to be communicatively coupled to the communication connector 112 (shown in FIG. 1). The module circuit board 186 has an edge 188 at the front end 184 configured to be plugged into a card slot of the communication connector 112 (shown in FIG. 1). Contact pads are provided at the edge 188, such as along the upper surface and the lower surface of the module circuit board 186 for electrical connection with contacts of the communication connector 112. The module circuit board 186 is received in the cavity 196 and surrounded by the upper shell 190 and the lower shell 192. The module circuit board 186 may be accessible at the mating end 182. The module circuit board 186 may include components, circuits and the like used for operating and/or using the pluggable module 106. For example, the module circuit board 186 may have conductors, traces, pads, electronics, sensors, controllers, switches, inputs, outputs, and the like associated with the module circuit board 186, which may be mounted to the module circuit board 186, to form various circuits.

In an exemplary embodiment, the pluggable body 180 provides heat transfer for the module circuit board 186, such as for the electronic components on the module circuit board 186. For example, the module circuit board 186 is in thermal communication with the upper shell 190 and/or the lower shell 192. The pluggable body 180 transfers heat from the module circuit board 186. In an exemplary embodiment, the upper shell 190 is configured to interface with the heat sink 144 (shown in FIG. 1) to dissipate heat from the pluggable module 106. In various embodiments, the pluggable body 180 may include a plurality of heat transfer fins (not shown) along at least a portion of the pluggable module 106, such as the top wall 191. The fins transfer heat away from the main shell of the pluggable body 180, and thus from the module circuit board 186 and associated components. In the illustrated embodiment, the fins are parallel plates that extend lengthwise; however, the fins may have other shapes in alternative embodiments, such as cylindrical or other shaped posts.

Figure 3:
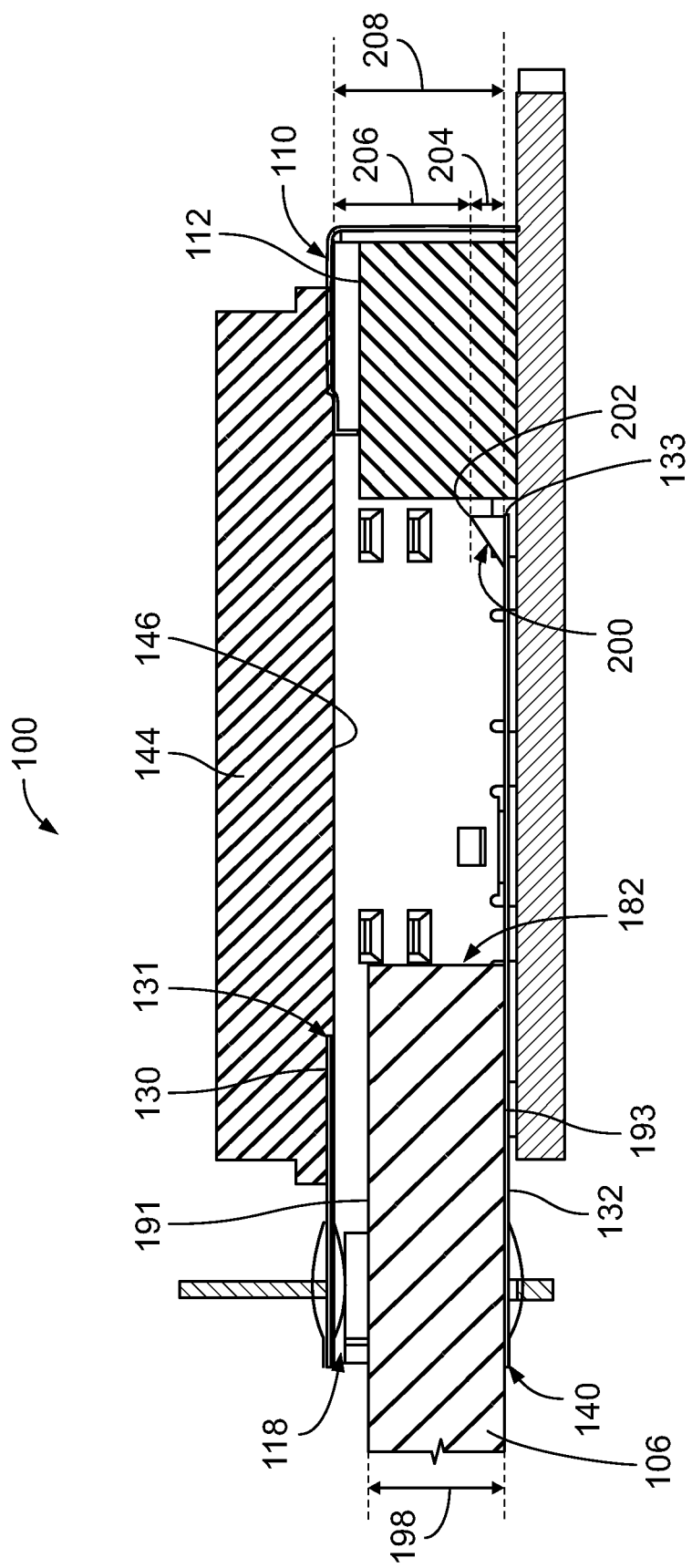
FIG. 3 is a cross sectional view of a portion of the communication system showing a receptacle cage in accordance with an exemplary embodiment.

FIG. 3 is a cross sectional view of a portion of the communication system 100 showing the receptacle cage 110 in accordance with an exemplary embodiment. The lifting device 200 is shown schematically in FIG. 3. The heat sink 144 is shown in FIG. 3 coupled to the receptacle cage 110. For example, the heat sink 144 is coupled to the top wall 130. In an exemplary embodiment, the heat sink 144 extends through a top opening 131 in the top wall 130. The heat sink 144 extends into the module channel 118 to interface with the pluggable module 106 when the pluggable module 106 is loaded into the module channel 118. In an exemplary embodiment, the heat sink 144 includes a heat transfer surface 146 configured to interface with the pluggable module 106. The heat transfer surface 146 is provided at the bottom of the heat sink 144. In various embodiments, the heat transfer surface 146 may be generally coplanar with the interior surface of the top wall 130. In other various embodiments, the heat sink 144 may extend into the module channel 118 such that the heat transfer surface 146 is below the interior surface of the top wall 130.

The lifting device 200 is provided in the module channel 118 proximate to the communication connector 112. The lifting device 200 is configured to interface with the pluggable module 106 at the end of the loading process of the pluggable module 106 into the module channel 118 (for example, when the mating end 182 of the pluggable module 106 is about to interface with the communication connector 112). In the illustrated embodiment, the lifting device 200 is located in the module channel 118 proximate to the bottom wall 132. The lifting device 200 is located remote from the front end 140. For example, the lifting device 200 may be located at a rear edge 133 of the bottom wall 132. The lifting device 200 is used to position the mating end 182 of the pluggable module 106 relative to the communication connector 112.

In an exemplary embodiment, the lifting device 200 has a lifting surface 202 configured to engage the pluggable module 106 and lift the pluggable module 106 into the module channel 118 to an elevated position lifted off of the bottom wall 132. When the pluggable module 106 engages the lifting surface 202, the pluggable module 106 is forced upward toward the upper wall 130 and toward the heat sink 144 at the upper wall 130. In an exemplary embodiment, the lifting surface 202 is located a first height 204 above the bottom wall 132. The lifting device 200 is configured to hold the bottom of the pluggable module 106 at the first height 204 in an elevated position spaced apart from and off of the bottom wall 132.

In an exemplary embodiment, the lifting surface 202 is located a first distance 206 from the top wall 130. The bottom wall 132 is located a second distance 208 from the top wall 130 greater than the first distance 206. When the pluggable module 106 is loaded into the module channel 118, the bottom of the pluggable module 106 may be located at the second distance 208. When the pluggable module 106 interfaces with the lifting device 200, the bottom of the pluggable module 106 is located at the first distance 206, and is thus closer to the top wall 130. As the pluggable module 106 is lifted off of the bottom wall 132, the top of the pluggable module 106 is driven closer to the top wall 130, such as to interface with the heat sink 144. The pluggable module 106 is moved toward the top wall 130 when the pluggable module 106 interfaces with the lifting device 200. In an exemplary embodiment, the pluggable module 106 has a height 198 between the top wall 191 and the bottom wall 193. The height 198 is less than the second distance 208 between the top wall 130 and the bottom wall 132 of the receptacle cage 110 providing a space in the module channel 118 allowing the pluggable module 106 to be movable (for example, vertically) within the module channel 118. The extra space allows the top wall 191 of the pluggable module 106 to be spaced apart from the top wall 130 and the heat sink 144. For example, prior to interfacing with the lifting device 200, the top of the pluggable module 106 may be spaced apart from the heat sink 144 to reduce insertion forces and to reduce wear on the heat sink 144 and the pluggable module 106.

Figure 4:
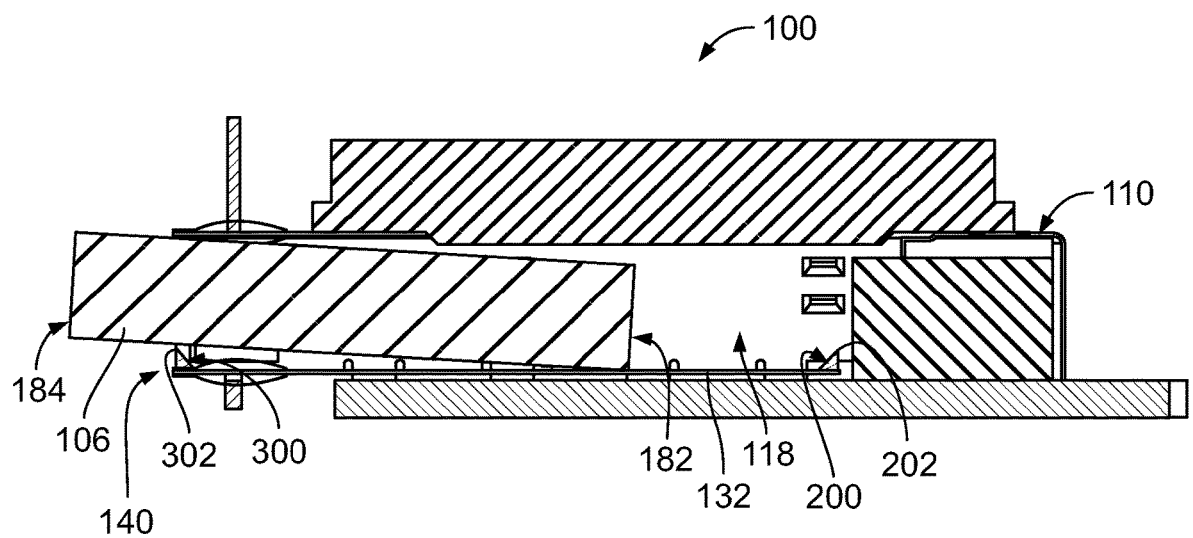
FIG. 4 is a cross sectional view of a portion of the communication system in accordance with an exemplary embodiment showing the pluggable module partially loaded into the receptacle cage.
Figure 5:
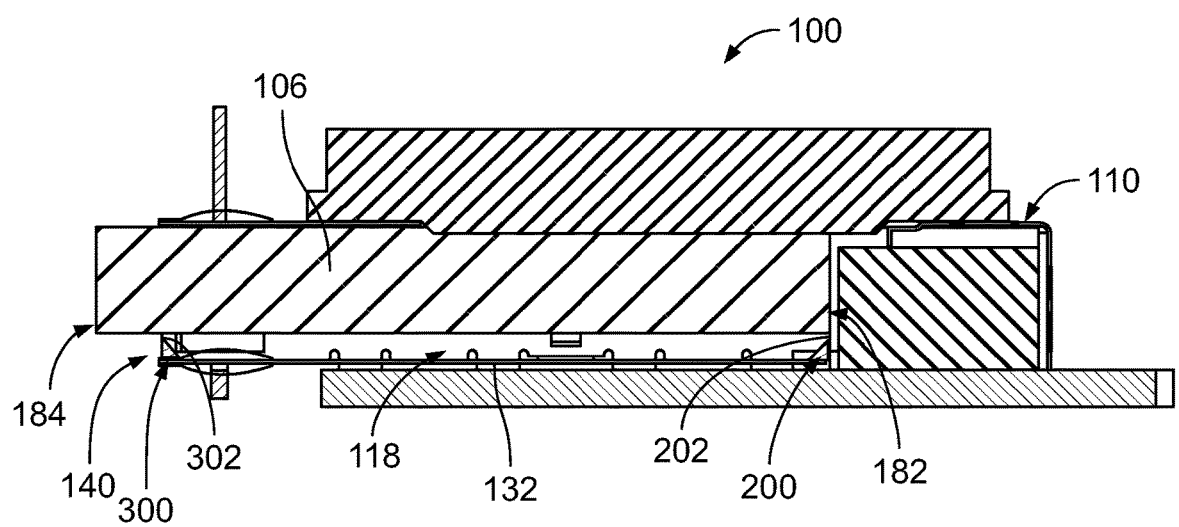
FIG. 5 is a cross sectional view of a portion of the communication system in accordance with an exemplary embodiment showing the pluggable module fully loaded into the receptacle cage.

FIG. 4 is a cross sectional view of a portion of the communication system 100 in accordance with an exemplary embodiment showing the pluggable module 106 partially loaded into the receptacle cage 110. FIG. 5 is a cross sectional view of a portion of the communication system 100 in accordance with an exemplary embodiment showing the pluggable module 106 fully loaded into the receptacle cage 110.

FIGS. 4 and 5 include a front lifting device 300. The front lifting device 300 is located proximate to the front end 140 of the receptacle cage 110. The front lifting device 300 holds the pluggable module 106 off of the bottom wall 132. The front lifting device 300 includes a front lifting surface 302. In an exemplary embodiment, the pluggable module 106 is suspended between the front lifting surface 302 of the front lifting device 300 and the lifting surface 202 of the lifting device 200 in a lifted position. For example, the front lifting device 300 supports the front end 184 of the pluggable module 106 and the lifting device 200 supports the mating end 182 of the pluggable module 106. In an exemplary embodiment, the pluggable module 106 is loaded into the module channel 118 at a slight angle. For example, the mating end 182 is loaded over the front lifting device 300 into the module channel 118. The mating end 182 engages the bottom wall 132 and slides along the bottom wall 132 over the front lifting device 300. When the mating end 182 engages the lifting device 200, then the mating end 182 is lifted off of the bottom wall 132 to suspend the pluggable module 106 between the lifting surfaces 202, 302.

Figure 6:
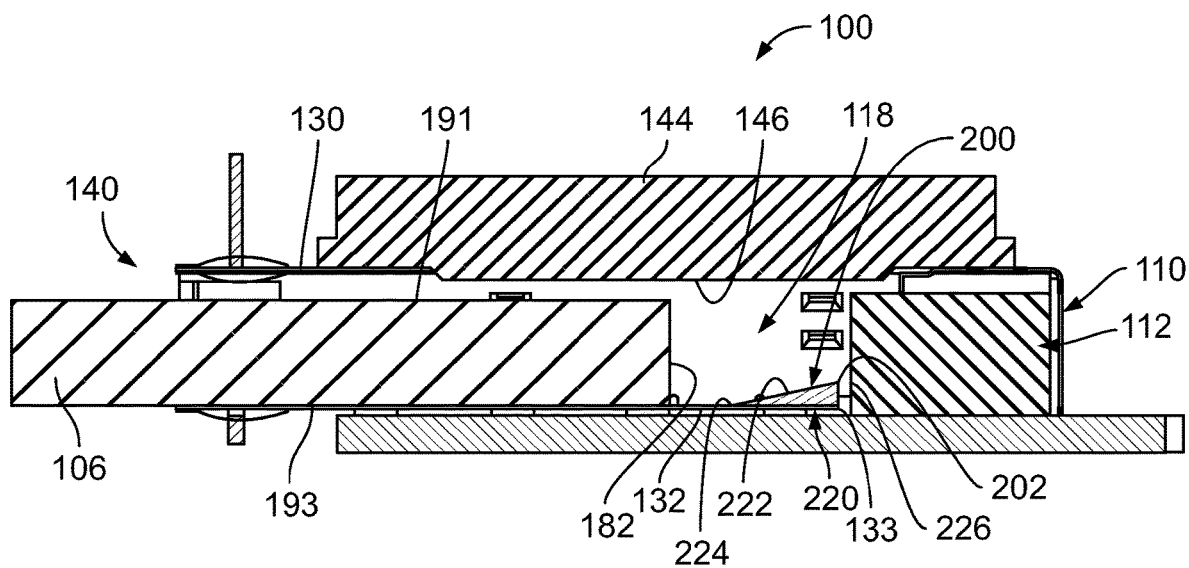
FIG. 6 is a cross sectional view of a portion of the communication system in accordance with an exemplary embodiment showing the pluggable module partially loaded into the receptacle cage.
Figure 7:
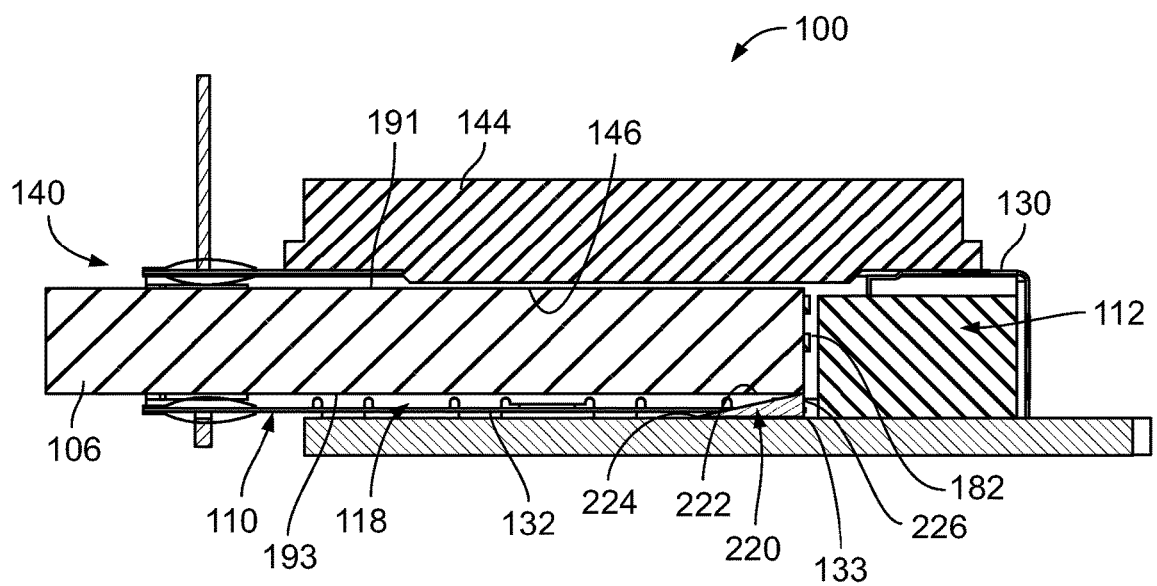
FIG. 7 is a cross sectional view of a portion of the communication system in accordance with an exemplary embodiment showing the pluggable module fully loaded into the receptacle cage.

FIG. 6 is a cross sectional view of a portion of the communication system 100 in accordance with an exemplary embodiment showing the pluggable module 106 partially loaded into the receptacle cage 110. FIG. 7 is a cross sectional view of a portion of the communication system 100 in accordance with an exemplary embodiment showing the pluggable module 106 fully loaded into the receptacle cage 110.

In an exemplary embodiment, the lifting device 200 includes a ramp 220. The ramp 220 has an inclined surface 222 extending between the bottom wall 132 and the lifting surface 202. The inclined surface 222 begins at a front 224 of the ramp 220. The lifting surface 202 is at a peak of the ramp 220. The lifting surface 202 may be at a top of the ramp 220. The lifting surface 202 may be provided at a rear 226 of the ramp 220. In an exemplary embodiment, the inclined surface 222 is planar at an inclined angle. In other various embodiments, the inclined surface may be curved, such as being gradually inclined at the front 224 and steeply inclined at the rear 226. The lifting surface 202 may be a point. Alternatively, the lifting surface may be a flat surface at the peak of the ramp 220 (for example, the ramp 220 may be plateaued).

The ramp 220 is configured to interface with the pluggable module 106 at the end of the loading process of the pluggable module 106 into the module channel 118 (for example, when the mating end 182 of the pluggable module 106 is about to interface with the communication connector 112). In the illustrated embodiment, the ramp 220 is located remote from the front end 140 at the rear edge 133 of the bottom wall 132.

During loading of the pluggable module 106 into the module channel 118, the pluggable module 106 slides along an interior surface of the bottom wall 132. The pluggable module 106 has a reduced height compared to the height of the module channel 118 to position the top wall 191 of the pluggable module 106 in a spaced apart position from the top wall 130 and the heat transfer surface 146 of the heat sink 144 (for example, to reduce wear of the surfaces during loading). When the pluggable module 106 engages the ramp 220, the ramp 220 is used to lift the mating end 182 of the pluggable module upward into the module channel 118. The bottom wall 193 is lifted off of the bottom wall 132. The top wall 191 is moved upward toward the heat sink 144. The pluggable module 106 slides along the inclined surface 222 to the lifting surface 202. When the pluggable module 106 is moved along the ramp 220 to the lifting surface 202, the pluggable module 106 is forced upward toward the heat sink 144. The top wall 191 of the pluggable module 106 is forced into thermal engagement with the heat transfer surface 146. The pluggable module 106 engages the lifting surface 202 at the end of the loading process in the fully loaded position (FIG. 7). As such, the pluggable module 106 engages the heat transfer surface 146 at the end of the loading process. In the fully loaded position, the ramp 220 holds the bottom wall 193 of the pluggable module 106 in an elevated position spaced apart from and off of the bottom wall 132. The pluggable module 106 may be spaced apart from the heat sink 144 as the pluggable module is loaded into the module channel 118 when partially loaded (FIG. 6), such as prior to engaging the ramp 220 and while moving along the front of the inclined surface 222.

Figure 8:
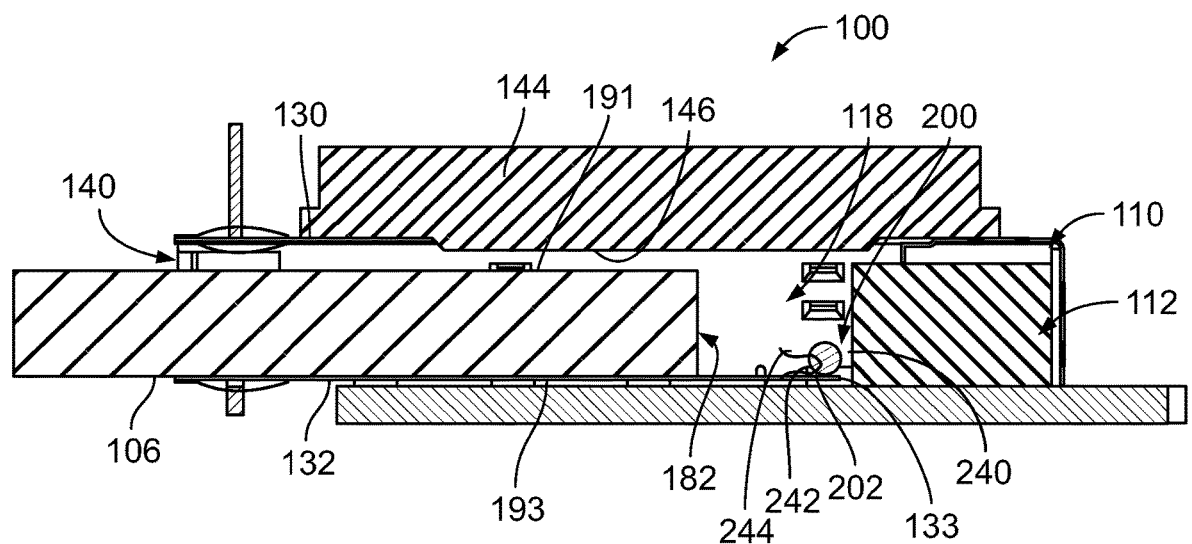
FIG. 8 is a cross sectional view of a portion of the communication system in accordance with an exemplary embodiment showing the pluggable module partially loaded into the receptacle cage.
Figure 9:
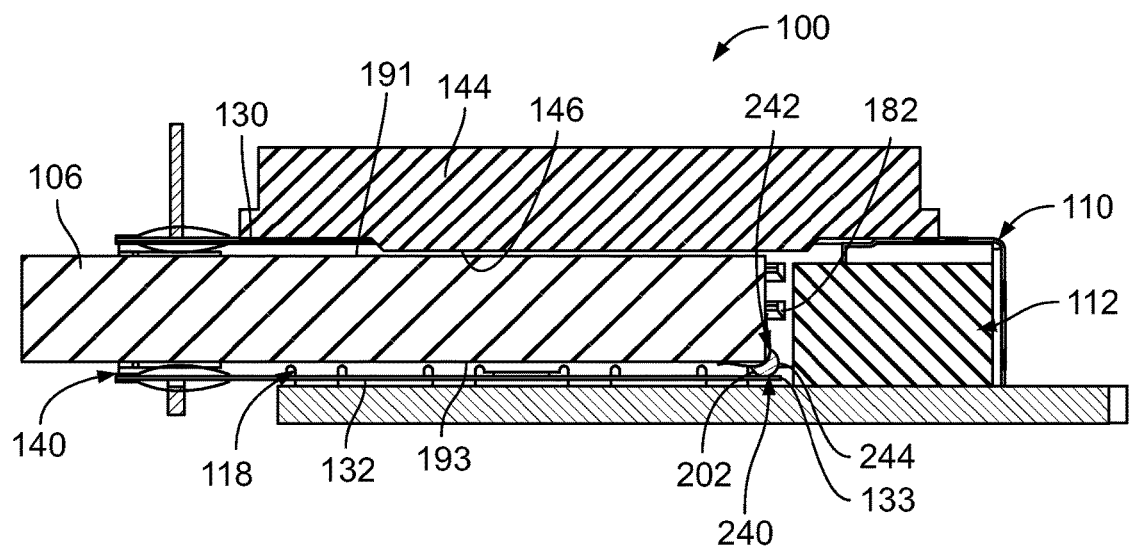
FIG. 9 is a cross sectional view of a portion of the communication system in accordance with an exemplary embodiment showing the pluggable module fully loaded into the receptacle cage.

FIG. 8 is a cross sectional view of a portion of the communication system 100 in accordance with an exemplary embodiment showing the pluggable module 106 partially loaded into the receptacle cage 110. FIG. 9 is a cross sectional view of a portion of the communication system 100 in accordance with an exemplary embodiment showing the pluggable module 106 fully loaded into the receptacle cage 110.

In an exemplary embodiment, the lifting device 200 includes a cam roller 240. The cam roller 240 is rotatable relative to the receptacle cage 110. The cam roller 240 may be automatically actuated, such as by engagement with the pluggable module 106 during the loading and unloading process. In other various embodiments, the cam roller 240 is manually actuated, such as by a lever or actuator accessible from the exterior of the receptacle cage 110. The cam roller 240 includes a pocket 242 that receives the bottom edge of the pluggable module 106. The pocket 242 is defined by the lifting surface 202 and an actuating surface 244. The cam roller 240 is movable between a receiving position (FIG. 8) and a lifting position (FIG. 9). The pocket 242 faces the front end 140 of the receptacle cage 110 in the receiving position to receive the bottom edge of the pluggable module 106. When the pluggable module 106 is received in the pocket 242 and continued to be moved in the loading direction, the pluggable module 106 engages the actuating surface 244. The movement of the pluggable module 106 in the loading direction and pressing against the actuating surface 244 causes the cam roller 240 to rotate. As the cam roller 240 rotates, the lifting surface 202 engages the bottom wall 193 of the pluggable module 106 and lifts the pluggable module 106 off of the bottom wall 132. The lifting surface 202 is movable relative to the bottom wall 193 and moves with the cam roller 240.

The cam roller 240 is configured to interface with the pluggable module 106 at the end of the loading process of the pluggable module 106 into the module channel 118 (for example, when the mating end 182 of the pluggable module 106 is about to interface with the communication connector 112). In the illustrated embodiment, the cam roller 240 is located remote from the front end 140 at the rear edge 133 of the bottom wall 132.

During loading of the pluggable module 106 into the module channel 118, the pluggable module 106 slides along an interior surface of the bottom wall 132. The pluggable module 106 has a reduced height compared to the height of the module channel 118 to position the top wall 191 of the pluggable module 106 in a spaced apart position from the top wall 130 and the heat transfer surface 146 of the heat sink 144 (for example, to reduce wear of the surfaces during loading). When the pluggable module 106 engages the cam roller 240, the cam roller 240 is used to lift the mating end 182 of the pluggable module 106 upward into the module channel 118. The bottom wall 193 is lifted off of the bottom wall 132. The top wall 191 is moved upward toward the heat sink 144. When the cam roller 240 is rotated, the lifting surface 202 forces the pluggable module 106 upward toward the heat sink 144. The top wall 191 of the pluggable module 106 is forced into thermal engagement with the heat transfer surface 146. The pluggable module 106 engages the heat transfer surface 146 at the end of the loading process (for example, when the cam roller 240 is rotated to the lifting position. In the fully loaded position, the cam roller 240 holds the bottom wall 193 of the pluggable module 106 in an elevated position spaced apart from and off of the bottom wall 132. The pluggable module 106 may be spaced apart from the heat sink 144 as the pluggable module is loaded into the module channel 118 when partially loaded (FIG. 8), such as prior to engaging the cam roller 240 and while the cam roller 240 is rotated from the receiving position to the lifting position.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "second," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A receptacle cage for a receptacle connector assembly comprising:
   cage walls including a top wall, a first side wall, a second side wall, and a bottom wall, the cage walls forming a module channel configured to receive a pluggable module, the cage walls extending between a front end and a rear end of the receptacle cage; and
   a lifting device located in the module channel proximate to the bottom wall, the lifting device located remote from the front end, the lifting device having a lifting surface configured to engage the pluggable module and lift the pluggable module into the module channel to an elevated position lifted off of the bottom wall.

2. The receptacle cage of claim 1, wherein the lifting surface is located a first height above the bottom wall.

3. The receptacle cage of claim 1, wherein the lifting surface is located a first distance from the top wall, the bottom wall being located a second distance from the top wall greater than the first distance.

4. The receptacle cage of claim 1, wherein the lifting surface is movable relative to the bottom wall.

5. The receptacle cage of claim 1, wherein the lifting device is movable relative to the bottom wall.

6. The receptacle cage of claim 1, wherein the lifting device comprises a cam roller rotatable relative to the bottom wall, the lifting surface being rotated with the cam roller.

7. The receptacle cage of claim 1, wherein the lifting device comprises an actuator accessible from an exterior of the receptacle cage, the actuator being actuated to move the lifting surface relative to the bottom wall.

8. The receptacle cage of claim 1, wherein the lifting device comprises a ramp having an inclined surface, the lifting surface provided proximate to a distal end of the inclined surface.

9. The receptacle cage of claim 1, wherein the top wall includes a top opening configured to receive a heat transfer device, the lifting device configured to drive the pluggable module into engagement with the heat transfer device as the pluggable module is loaded into the module channel.

10. The receptacle cage of claim 9, wherein the module channel is sized and shaped to receive the pluggable module without the pluggable module engaging the heat transfer device until the pluggable module interfaces with the lifting device.

11. The receptacle connector assembly of claim 9, wherein the heat transfer device extends through the top opening such that the heat transfer device is located interior of the module channel for interfacing with the pluggable module.

12. The receptacle connector assembly of claim 9, wherein the heat transfer device is fixed relative to the top wall and the bottom wall, the lifting device configured to move the pluggable module relative to the heat transfer device to drive the pluggable module toward the heat transfer device as the pluggable module is loaded into the module channel.

13. The receptacle connector assembly of claim 9, wherein the cage walls further define a second module channel configured to receive a second pluggable module, the receptacle connector assembly further comprising a second lifting device in the second module channel having a second lifting surface configured to engage the second pluggable module and lift the second pluggable module to an elevated position lifted off of the bottom wall into thermal contact with the heat transfer device, the heat transfer device being fixed relative to the module channel and the second module channel.

14. The receptacle connector assembly of claim 9, wherein the lifting surface is located a first distance from the top wall, the bottom wall being located a second distance from the top wall greater than the first distance.

15. The receptacle cage of claim 1, wherein the module channel has a first height at the front end between the top wall and the bottom wall, and wherein the module channel has a second height between the top wall and the lifting surface less than the first height.

16. The receptacle cage of claim 1, wherein the bottom wall includes a rear edge, the cage walls include a rear wall at the rear end, the receptacle cage including a bottom opening aligned with the bottom wall between the rear edge and the rear wall, the bottom opening configured to receive a communication connector, the lifting device being located proximate to the rear edge.

17. The receptacle cage of claim 1, further comprising a front lifting device located proximate to the front end, the front lifting device configured to lift the pluggable module off of the bottom wall, wherein the front lifting device and the lifting device are configured to suspend the pluggable module therebetween at a lifted position spaced apart from the bottom wall.

* * * * *